(12) United States Patent
Bosiers

(10) Patent No.: US 8,405,018 B2
(45) Date of Patent: Mar. 26, 2013

(54) SEMICONDUCTOR IMAGER AND METHOD WITH SPATIALLY SEPARATED PROXIMATE AND DISTAL RESET GATES TO TUNE RELATIVE GAIN

(75) Inventor: Jan Theodoor Jozef Bosiers, Edegem (BE)

(73) Assignee: Teledyne Dalsa, Inc., Thousand Oaks, CA (US)

( * ) Notice: Subject to any disclaimer, the term of this patent is extended or adjusted under 35 U.S.C. 154(b) by 397 days.

(21) Appl. No.: 12/800,020

(22) Filed: May 6, 2010

(65) Prior Publication Data

US 2011/0272560 A1    Nov. 10, 2011

(51) Int. Cl.
*H01J 40/14* (2006.01)
*H04N 3/14* (2006.01)
(52) U.S. Cl. .................................. 250/214 R; 348/311
(58) Field of Classification Search .............. 250/214 R, 250/208.1; 348/311, 312, 314
See application file for complete search history.

(56) References Cited

U.S. PATENT DOCUMENTS

| 2003/0122948 A1* | 7/2003 | Uya et al. ...................... 348/312 |
| 2008/0197387 A1* | 8/2008 | Itonaga et al. ................ 257/292 |

* cited by examiner

*Primary Examiner* — Thanh Luu
(74) *Attorney, Agent, or Firm* — Eric A. Gifford

(57) ABSTRACT

A semiconductor imager device is arranged for receiving a series of charge packets. It comprises a charge-to-voltage conversion circuit for receiving the charge packets on a reception capacitance and has an interconnected arrangement of a floating diffusion, a first reset gate, a reset drain and a source follower for readout. In particular, the device has a series arrangement of at least the first reset gate as a proximate reset gate and furthermore a distal reset gate, wherein in a high-gain configuration the proximate reset gate is cyclically controlled and the distal reset gate is continuously on, thus limiting the reception capacitance to a relatively low value. Alternatively, in a low-gain configuration the proximate reset gate is continuously on, thus extending the capacitance to a relatively high value and the distal reset gate replaces the proximate reset gate as being cyclically controlled for conversion of the series of charge packets.

9 Claims, 2 Drawing Sheets

SEMICONDUCTOR IMAGER AND METHOD WITH SPATIALLY SEPARATED PROXIMATE AND DISTAL RESET GATES TO TUNE RELATIVE GAIN

BACKGROUND OF THE INVENTION

The invention relates to a semiconductor imager device being arranged for receiving a series of charge packets, comprising a charge-to-voltage conversion circuit arranged for receiving said charge packets on a reception capacitance, and having an interconnected arrangement of a floating diffusion, a first reset gate, a reset drain and a source follower for readout, as being recited in the preamble of claim 1. In particular, for high-speed operation, the reset gate transistor should be as small as reasonably feasible.

Now, various imaging applications would benefit from a facility that allows switching between different conversion gain values, in particular, between high values and low values, such being effected by switching the capacitance of the floating diffusion node instead of by switching the gain factor of the amplifier.

SUMMARY TO THE INVENTION

In consequence, amongst other things, it is an object of the present invention to provide a switching arrangement that in a high-gain configuration has a relatively small floating diffusion capacitance, and in a low-gain configuration has a relatively large floating diffusion capacitance, through then activating a supplementary capacitance in that a secondary reset gate replaces the primary reset gate as being controlled for conversion.

Now therefore, according to one of its aspects the invention is characterized in that said device has a series arrangement of at least said first reset gate as a proximate reset gate and furthermore a distal reset gate, wherein in a high-gain configuration said proximate reset gate is cyclically controlled and said distal reset gate is continuously on, thus limiting said reception capacitance to a relatively low value, whilst in a low-gain configuration said proximate reset gate is continuously on, thus extending said capacitance to a relatively high value and in that said distal reset gate replaces said proximate reset gate as being cyclically controlled for conversion of said series of charge packets, according to the characterizing part of claim 1. Thus, the invention provides a switcheable conversion gain imager device by changing the capacitance of a detection node by adding a capacitor outside the default detection node circuit.

The invention also relates to a method for operating such a semiconductor imager device, to a method for manufacturing such a semiconductor imager device and to a (multipixel) semiconductor image sensor comprising such a semiconductor imager device. Further advantageous aspects of the invention are recited in dependent Claims.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1A:
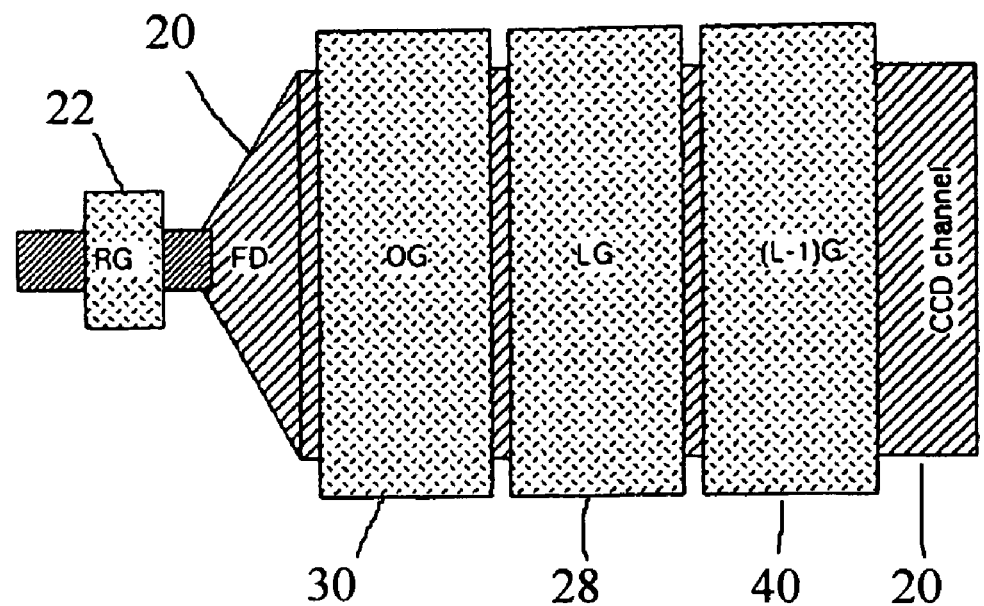
FIG. 1a, a layout of a prior art charge-to-voltage conversion circuit.
Figure 1B:
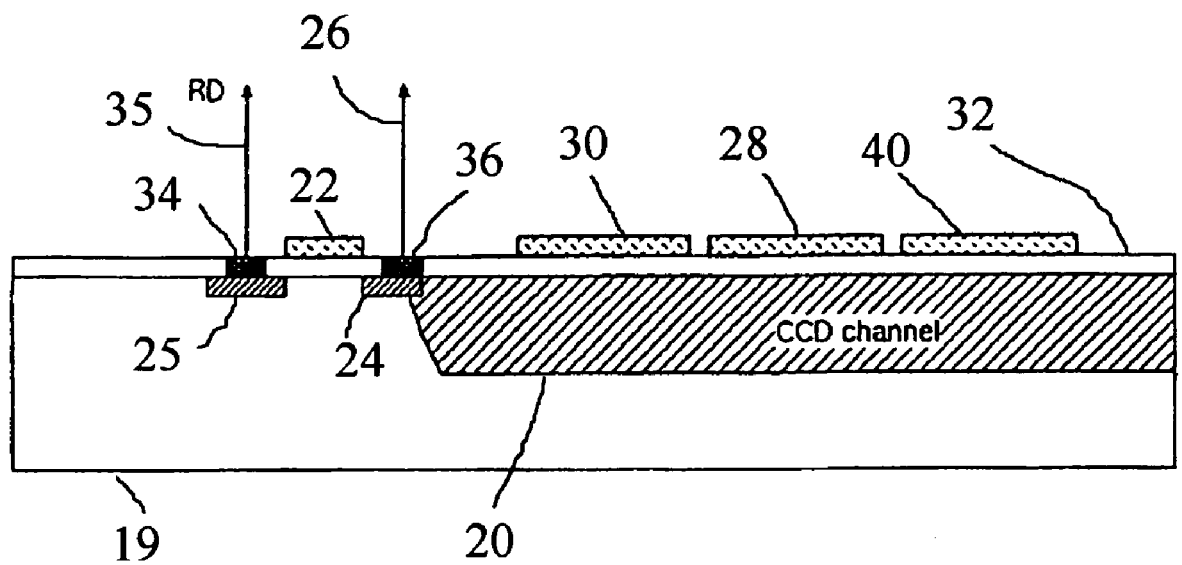
FIG. 1b, ditto in a cross-sectional image.

FIG. 1a, 1b illustrate a layout of a prior art charge-to-voltage conversion circuit and the same in a cross-sectional image, respectively.

Most CCD (=Charge Coupled Device) and CMOS (=Complimentary Metal Oxide Semiconductor) imagers use a charge-to-voltage conversion circuit for readout. As shown in FIGS. 1a, 1b for a CCD realization, these circuits are often composed of a floating diffusion FD 20 implanted in a substrate 19 and covered by an insulating layer 32 such as silicon oxide, a reset gate RG 22, reset drain RD 35 and a source follower SF, the latter not being shown in the drawing. Contact regions 36,34 (only shown in FIG. 1b) are formed on the source region 24 and the drain region 25 for interconnection through the insulation layer 32. The floating diffusion FD 20 is connected to the gate of the source follower amplifier, only in a symbolic manner indicated by reference numeral 26. By way of example, rather than by way of limitation, the circuit is presented for such imager wherein an n-type buried channel CCD 20 is being used. This ensues n+ source and drain implants 24,25. On the other hand, a feasible implementation would be with p, p+, respectively. On the other hand, MOS and other configurations in general usage are attained through straightforward interchanging the various elements of the arrangement.

The operation is as follows:

First, the floating diffusion is reset to the RD voltage by opening the reset gate RG 22.

Next, the reset gate RG is closed again.

The charge is then transported to the floating diffusion FD, in the particular CCD example shown by transferring the charge from the last clocked gate LG 28, under the output gate OG 30, to FD 20, by turning LG 28 off. It is noted that here the figure also shows the one but last clocked gate (L−1)G 40 of the CCD.

The signal electrons will thereby change the potential of the FD 20 node.

This change is then sensed by an output buffer not shown in detail, typically a sourcefollower 26 that has its gate connected to FD 20.

Advantageously, for attaining a high conversion factor, the RG transistor should be as small as feasible. In particular, designing a relatively narrow element RG 22 will minimize the capacitance between RG 22 and FD 20 on the one hand, and the clock feed-through, on the other. Likewise, a shorter RG 22 will have a lower on-resistance and produce low noise and high speed, and a smaller RG 22 area with less charge under the gate will cause lower partition noise when RG 22 is being turned off. The use of a surface RG 22 transistor allows a shorter RG 22 since a buried RG is more susceptible to short-channel effects.

To achieve the desirable lowest noise and largest charge-to-voltage conversion gain, in particular when sensing small charge packets (e.g. containing less than 25,000 electrons), the total capacitance of the FD node should preferably be kept as small as possible.

Figure 2A:
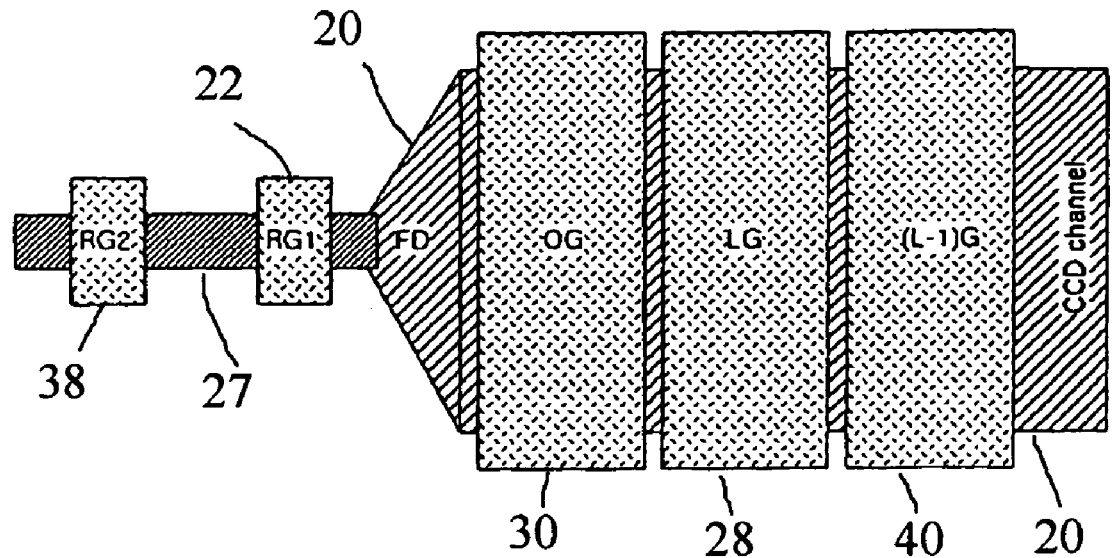
FIG. 2a, a layout of a charge-to-voltage conversion circuit according to the invention.
Figure 2B:
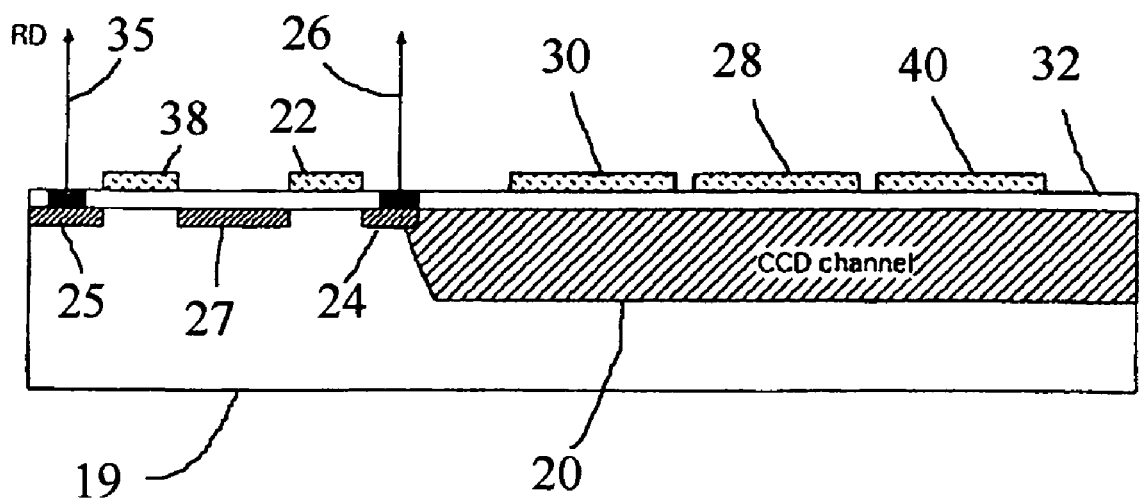
FIG. 2b ditto in a cross-sectional image.

On the other hand, in various imaging applications it would be beneficial to allow switching between low and high conversion gains, such as by a factor of 2. Other change factors could be advantageous as well, such as 2.5 or 1.5, but a factor of 2 is specifically advantageous for use with digital signal data processing, such as inter alia to avoid overloading at top signal intensity. The inventor has considered that advantageously, this should be done by switching the capacitance of the FD node, in contradistinction to switching the gain of the amplifier itself. In particular, the following concept illustrates an implementation that goes without increasing the capacitance of the FD node in the high-sensitivity node. This objective is effected by adding the extra capacitance outside the high-sensitivity node, i.e. behind the reset gate that resides on the proximate or closer by position. In particular, FIG. 2a illustrates a layout of a charge-to-voltage conversion circuit according to the invention, whereas FIG. 2b illustrates a cross-sectional image thereof.

The operation is as follows:
  in a high sensitivity mode, the gate RG2 38 that is located on a distal or further away position relative to RG1 22, is always on, and FD 20 is reset by RG1, like in FIG. 1. The additional circuit between RD and RG2 has only a negligible impact on the temporal performance, which is almost identical to that of FIG. 1.
  in a low sensitivity mode, RG2 is used for reset, while RG1 is always on, and the effective FD node is extended by RG1 and the channel between RG1 and RG2. Thus the effective FD capacitance is increased, and the conversion gain is decreased. The amount of increase of FD can be easily adjusted to the required value, without modifying the performance of the high-sensitivity mode. This can be done by changing the size of the extra channel 27 or by providing additional capacitance by adding a conductor nearby this channel.

Note that the proposed new implementation reduces the conversion gain by increasing the capacitance of FD, and not by decreasing the gain proper of the amplifier. This approach is preferred since often the swing of the floating diffusion is the factor that determines the maximum charge handling capacity. In consequence, reducing the gain of the subsequent amplifier would represent a less advantageous solution.

In particular, FIG. 2 shows that the maximum conversion gain is not compromised; the area up to and including RG1 has not changed in the layout. It is also clear that RG2 can be designed identical to RG1 (narrow and small), and that the design of the n+ area 27 between RG1 and RG2 can be chosen with a very large degree of freedom to realize the necessary greater FD capacitance.

Critical aspects of the present design are inter alia that reset gates RG1, RG2 are spatially separated by region 27 that may be dimensioned relatively freely to tune the relation between the two gain factors to a selected value. A value in the region of 1.5 to 3 or even larger would be readily attainable. Values near 1 with RG1, RG2 relatively close together would however, in general have quite limited operational merits in the context of the present invention.

It is clear from the present disclosure that the invention allows to tailor two distinct parameters to the envisaged operation. First, the overall capacitance of FD with respect to the substrate, the output gate OG, the source follower SF, and the reset gate RG1 determines the high-gain conversion factor without necessitating additional capacitance that would lower sensitivity. Second, the relation between the two distinct capacitances determines the relative attenuation factor.

An advantage of the present layout is that an $n^+$ area 27 between RG1 and RG2 is provided instead of a DC gate since this latter implementation would require an additional electrical connection, and limits the design flexibility of the area between RG1 and RG2.

Various design variances may be implemented. The additional capacitance can be positioned somewhere off the device axis. Reset gates can be in MOS technology. A higher number of reset gates, such as three, may be used advantageously.

The invention claimed is:
1. A semiconductor imager device being arranged for receiving a series of charge packets, comprising a charge-to-voltage conversion circuit arranged for receiving said charge packets on a reception capacitance, and having an interconnected arrangement of a floating diffusion, a first reset gate, a reset drain and, and a source follower for readout, characterized in that said device has a series arrangement of at least said first reset gate as a proximate reset gate and furthermore a distal reset gate, wherein said proximate reset gate and said distal reset gate are spatially separated by a region, wherein in a high-gain configuration said proximate reset gate is cyclically controlled and said distal reset gate is continuously on, thus limiting said reception capacitance to a relatively low value, whilst in a low-gain configuration said proximate reset gate is continuously on, thus extending said capacitance to a relatively high value corresponding to a low gain factor and in that said distal reset gate replaces said proximate reset gate as being cyclically controlled for conversion of said series of charge packets, wherein said region is dimensioned so that a ratio of the high gain factor to the low gain factor is tuned to a selected value of at least 1.5.

2. A semiconductor imager device as claimed in claim 1, wherein said relatively high value is substantially twice said relatively low value.

3. A semiconductor imager device as claimed in claim 1, wherein the region is a highly doped n-type surface region that is present between the first reset gate and the distal reset gate.

4. A semiconductor image sensor comprising a semiconductor imager device as claimed in claim 1.

5. A semiconductor imager device as claimed in claim 1, wherein said proximate reset gate and said distal reset gate are identical in both size and in dielectric constant of an underlying surface region on opposite sides of the region separating the gates.

6. A method for operating a semiconductor imager device that is arranged for receiving a series of charge packets, through comprising a charge-to-voltage conversion circuit arranged for receiving said charge packets on a reception capacitance, by means of an interconnected arrangement of a floating diffusion, a first reset gate, a reset drain, and a source follower for readout,
  said method being characterized by operating a series arrangement of at least said first reset gate as a proximate reset gate and furthermore a distal reset gate, wherein said proximate reset gate and said distal reset gate are spatially separated by a region, wherein in a high-gain configuration cyclically controlling said proximate reset gate and maintaining said distal reset gate continuously on, thus limiting said reception capacitance to a relatively low value corresponding to a high gain factor, whilst in a low-gain configuration maintaining said proximate reset gate continuously on, thus extending said capacitance to a relatively high value corresponding to a low gain factor and by cyclically controlling said distal reset gate to replace said proximate reset gate for converting said series of charge packets, and wherein said region is dimensioned so that a ratio of the high gain actor to the low gain factor is tuned to a selected value of at least 1.5.

7. The method as claimed in claim 6, wherein said proximate reset gate and said distal reset gate are identical in both size and in dielectric constant of an underlying surface region on opposite sides of the region separating the gates.

8. A method for manufacturing a semiconductor imager device being arranged for receiving a series of charge packets, by providing a charge-to-voltage conversion circuit arranged for receiving said charge packets on a reception capacitance, and thereby providing an interconnected arrangement of a floating diffusion, a first reset gate, a reset drain, and a source follower for readout, characterized by providing to said device has an interconnected arrangement of at least said first reset gate as a proximate reset gate and furthermore a distal reset gate, wherein said proximate reset gate and said distal reset gate are spatially separated by a region, whilst for a high-gain configuration cyclically controlling said proximate reset gate and maintaining said distal reset gate continuously on, thus limiting said reception capacitance to a relatively low value corresponding to a high gain factor, whilst allowing in a low-gain configuration said proximate reset gate continuously on, thus extending said capacitance to a relatively high value corresponding to a low gain factor and allowing said distal reset gate to replace said proximate reset gate as being cyclically controlled for conversion of said series of charge packets, and dimensioning said region so that a ratio of the high gain factor to the low gain factor is tuned to a selected value of at least 1.5.

9. The method as claimed in claim 8, wherein said proximate reset gate and said distal reset gate are identical in both size and in dielectric constant of an underlying surface region on opposite sides of the region separating the gates.

* * * * *